United States Patent
Grille et al.

(10) Patent No.: US 10,217,644 B2
(45) Date of Patent: Feb. 26, 2019

(54) PRODUCTION OF ADHESION STRUCTURES IN DIELECTRIC LAYERS USING PHOTOPROCESS TECHNOLOGY AND DEVICES INCORPORATING ADHESION STRUCTURES

(75) Inventors: Thomas Grille, Villach (AT); Ursula Hedenig, Villach (AT); Joern Plagmann, Munich (DE); Helmut Schoenherr, Villach (AT); Ralph Muth, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 521 days.

(21) Appl. No.: 13/556,217

(22) Filed: Jul. 24, 2012

(65) Prior Publication Data
US 2014/0027915 A1    Jan. 30, 2014

(51) Int. Cl.
*H01L 21/311*  (2006.01)
*H01L 21/768*  (2006.01)
(Continued)

(52) U.S. Cl.
CPC ... *H01L 21/31111* (2013.01); *H01L 21/31116* (2013.01); *H01L 21/76822* (2013.01);
(Continued)

(58) Field of Classification Search
CPC ......... H01L 21/76801; H01L 21/76802; H01L 21/76804; H01L 21/02359; H01L 21/02422; H01L 21/28079; H01L 21/28088; H01L 21/4763; H01L 21/02107; H01L 21/02109; H01L 2221/1005; H01L 2221/101; H01L 2224/0391; H01L 2224/03916; H01L 2224/27916; H01L 2224/023; H01L 2224/0236; H01L 2224/024; H01L 2224/0237;
(Continued)

(56) References Cited

U.S. PATENT DOCUMENTS 3,523,039 A * 8/1970 Ramsey, Jr. ........... G03C 1/705
257/734
5,124,781 A * 6/1992 Tashiro ............... H01L 23/5226
257/759
(Continued)

FOREIGN PATENT DOCUMENTS

CN      1435881       8/2003
CN   102598250 A     7/2012
(Continued)

OTHER PUBLICATIONS

Office Action received for German Patent Application No. 102013107784.6, dated Oct. 23, 2014 (for information purposes only), 6 pages.

*Primary Examiner* — Michelle Mandala
(74) *Attorney, Agent, or Firm* — Viering, Jentschura & Partner MBB (57) ABSTRACT

In various aspects of the disclosure, a semiconductor device including at least one semiconductor die; a dielectric layer adjoining the semiconductor die; geometric structures formed in the dielectric layer; and a conductive layer deposited over the dielectric layer, wherein the conductive layer is at least partially located over the geometric structures.

20 Claims, 6 Drawing Sheets

(51) Int. Cl.
*H01L 23/31* (2006.01)
*H01L 23/00* (2006.01)

(52) U.S. Cl.
CPC .......... *H01L 23/3142* (2013.01); *H01L 24/05* (2013.01); *H01L 23/3192* (2013.01); *H01L 2224/02351* (2013.01); *H01L 2224/0401* (2013.01); *H01L 2224/05124* (2013.01); *H01L 2224/05144* (2013.01); *H01L 2224/05147* (2013.01); *H01L 2224/05166* (2013.01); *H01L 2224/05548* (2013.01); *H01L 2224/05557* (2013.01); *H01L 2224/05567* (2013.01); *H01L 2224/05624* (2013.01); *H01L 2224/05644* (2013.01); *H01L 2224/05655* (2013.01); *H01L 2224/131* (2013.01); *H01L 2924/00014* (2013.01)

(58) Field of Classification Search
CPC . H01L 2224/02373; H01L 2224/05548; H01L 2224/05557; H01L 23/08; H01L 23/49894; H01L 23/5329; H01L 23/3142; H01L 23/192; H01L 23/498; H01L 23/50; H01L 2924/01022; H01L 2924/00014; H01L 2924/014; H01L 2224/05124; H01L 2224/05144; H01L 2224/05147; H01L 2224/05166; H01L 2224/05567; H01L 2224/05624; H01L 2224/05644; H01L 2224/05655; H01L 2224/131; H01L 2224/0401; H01L 21/31111; H01L 21/31116; H01L 21/76822; H01L 21/02129; H01L 21/02112; H01L 21/02123; H01L 24/05; H01L 2924/01013; H01L 2924/01014; H01L 2924/01029; H01L 2924/01078; H01L 2924/01079; H01L 2924/14; H01L 2924/3011; H01L 23/3171; H01L 23/3178; H01L 23/5226; H01L 21/00; H01L 21/02126; H01L 21/02216; H01L 21/02282; H01L 21/76205; H01L 29/00; H01L 21/76841; H01L 2224/8089; H01L 2224/8289; H01L 2224/8389; H01L 2224/8489; G01R 31/2822
USPC ........ 257/459, 644, 650, 770, E21.585, 753, 257/E21.159, E23.072, 626, 638, 775; 438/723, 743, 685
See application file for complete search history.

(56) References Cited

U.S. PATENT DOCUMENTS

| | | | |
|---|---|---|---|
| 5,703,408 A * | 12/1997 | Ming-Tsung et al. ........ 257/784 | |
| 5,707,715 A * | 1/1998 | deRochemont ....... H01L 23/142 | 257/E23.006 |
| 5,707,894 A | 1/1998 | Hsiao | |
| 5,922,496 A * | 7/1999 | Dalal ........................ G03F 7/40 | 101/127 |
| 5,989,991 A | 11/1999 | Lien | |
| 6,028,363 A * | 2/2000 | Lin ...................... H01L 23/5226 | 257/773 |
| 6,143,432 A * | 11/2000 | de Rochemont ....... B32B 15/00 | 257/E23.006 |
| 6,222,270 B1 | 4/2001 | Lee | |
| 6,255,586 B1 | 7/2001 | Kim et al. | |
| 6,323,111 B1 * | 11/2001 | Hui ..................... H01L 23/5256 | 257/529 |
| 6,335,567 B1 * | 1/2002 | Ahn .................... H01L 23/5283 | 257/734 |
| 6,420,788 B1 | 7/2002 | Chen | |
| 2001/0019180 A1 | 9/2001 | Aoyagi et al. | |
| 2002/0086169 A1 * | 7/2002 | Nakata .................. C08G 77/16 | 428/447 |
| 2003/0194872 A1 * | 10/2003 | Parikh ............... H01L 21/76805 | 438/694 |
| 2004/0031981 A1 * | 2/2004 | Grivna ............. H01L 29/42304 | 257/302 |
| 2004/0082106 A1 | 4/2004 | Lee et al. | |
| 2004/0195642 A1 | 10/2004 | Angell et al. | |
| 2005/0054195 A1 * | 3/2005 | Handa et al. ................. 438/638 | |
| 2006/0063359 A1 * | 3/2006 | Stacey ............. H01L 21/02126 | 438/494 |
| 2006/0234497 A1 * | 10/2006 | Yang ................. H01L 21/76807 | 438/638 |
| 2008/0099914 A1 | 5/2008 | Saito | |
| 2008/0174011 A1 * | 7/2008 | Fu .................................. 257/737 | |
| 2008/0197505 A1 * | 8/2008 | Asakawa ....................... 257/773 | |
| 2009/0087992 A1 * | 4/2009 | Srivastava et al. ........... 438/701 | |
| 2009/0102065 A1 * | 4/2009 | Lee ................................ 257/784 | |
| 2009/0166859 A1 * | 7/2009 | Yuan et al. .................... 257/737 | |
| 2009/0325379 A1 * | 12/2009 | Hlad ................... H01L 21/4846 | 438/674 |
| 2010/0187677 A1 * | 7/2010 | Lee ............................... 257/692 | |
| 2012/0211269 A1 | 8/2012 | Saitou et al. | |
| 2012/0211883 A1 * | 8/2012 | Uehling ............. H01L 23/5226 | 257/737 |
| 2012/0326296 A1 * | 12/2012 | Choi .................... H01L 23/3171 | 257/737 |
| 2015/0364420 A1 * | 12/2015 | Lin .................... H01L 23/5283 | 257/775 |

FOREIGN PATENT DOCUMENTS

| | | | |
|---|---|---|---|
| DE | 10103966 A1 | 3/2002 | |
| JP | H01256152 A | 10/1989 | |
| JP | 01293632 A * | 11/1989 | ............ H01L 21/90 |
| JP | 2000232179 A | 8/2000 | |
| JP | 2004158679 A | 6/2004 | |
| JP | 2009177072 A | 8/2009 | |
| WO | WO 2011052744 A1 * | 5/2011 | |

* cited by examiner

PRODUCTION OF ADHESION STRUCTURES IN DIELECTRIC LAYERS USING PHOTOPROCESS TECHNOLOGY AND DEVICES INCORPORATING ADHESION STRUCTURES

TECHNICAL FIELD

Various aspects of the disclosure relate generally to methods for the improving adhesion in dielectric layers.

BACKGROUND

Today, fabrication of integrated circuit devices usually includes the formation of metal bond pads at the surface of the device. There are sometimes problems with adhesion of the metal bond pads to the underlying dielectric surfaces. It may be useful to improve the adhesion of metal bond pads to such surfaces.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the disclosure of the invention are described with reference to the following drawings, in which.

DESCRIPTION

In various aspects of the disclosure, devices may be provided that may include one or more bond pads overlying a textured substrate. The textured surface may be formed by forming geometric structures in the surface. The geometric structure pattern may be formed by through a photolithographic process. The bond pads may be formed of a metal material. The textured surface may comprise a silicon material. The silicon-containing material may comprise boron phosphate silicate glass (BPSG). Pattern dimensions may be varied to increase the level of adhesion to the surface. Adhesion may also be varied depending on the process used to form the geometric structures.

The following detailed description refers to the accompanying drawings that show, by way of illustration, specific details and aspects of the disclosure in which exemplary embodiments may be practiced. Other aspects of the disclosure may be utilized and structural, logical, and electrical changes may be made without departing from the scope of the disclosure. The various aspects of the disclosure are not necessarily mutually exclusive, as some aspects of the disclosure can be combined with one or more other aspects of the disclosure to form new aspects of the disclosure. The following detailed description therefore is not to be taken in a limiting sense, and the scope of the present examples is defined by the appended claims.

Various aspects of the disclosure are provided for devices, and various aspects of the disclosure are provided for methods. It will be understood that basic properties of the devices also hold for the methods and vice versa. Therefore, for sake of brevity, duplicate description of such properties may be omitted.

The terms "coupling" or "connection" as used herein may be understood to include a direct "coupling" or direct "connection" as well as an indirect "coupling" or indirect "connection", respectively.

The terms "disposed over", "located over" or "arranged over" as used herein are intended to include arrangements where a first element or layer may be disposed, located or arranged directly on a second element or layer with no further elements or layers in-between, as well as arrangements where a first element or layer may be disposed, located or arranged above a second element or layer with one or more additional elements or layers between the first element or layer and the second element or layer.

The term "bond pad" as used herein may be understood to include, for example, pads that form the surface connection point of a die or chip. In case that a ball attach process is applied, the term "ball pad" may also be used.

The term "redistribution trace" as used herein may be understood to include, for example, conductive lines or traces disposed over a semiconductor device's or wafer's active surface and used to relocate a bond pad of the semiconductor device or wafer. In other words, a bond pad's original location over the semiconductor device or wafer may be shifted to a new location by means of a redistribution trace which may serve as an electrical connection between the (relocated) bond pad at the new location and an electrical contact (or pad) at the original location over the semiconductor device or wafer.

The term "redistribution layer (RDL)" as used herein may be understood to refer to a layer including at least one or a set of redistribution traces used to relocate ("redistribute") a plurality of bond pads of a die or wafer.

In the manufacture of semiconductor devices, there is a need to provide a point in the device surface for the connection of the device to external packaging or to a larger electronic device, such as a circuit board. This is typically accomplished by attaching a metal lead or connection to the semiconductor device through a bond pad. The bond pad forms the terminal point of a device interconnect, such as a redistribution layer in a fan-out design package, for instance. The bond pad provides a relatively large connection surface to which the metal lead or connection is attached through bonding processes known in the art, such as through solder balls, for instance.

During usage, the electronic device and semiconductor device will typically undergo various stresses due to, for example, thermal cycling and shock due to impacts, for instance. These stresses will in turn be transmitted to various electrical connections within the devices, including the electrical connection between the bond pad and the external package or PCB. If the stress is severe enough, the connection can be broken, potentially resulting in failure of the device. Breakage can occur in any number of places within the connections, but of particular interest in this instance is connection failure due to loss of bond pad adhesion. In this instance, the bond pad and electrical connection remain electrically connected. However, the bond pad lifts off of the surface of the semiconductor device, thus being at least partially disconnected from the underlying interconnect. Therefore, it is of interest to improve the adhesion of bond pads to the underlying substrate.

Figure 1:
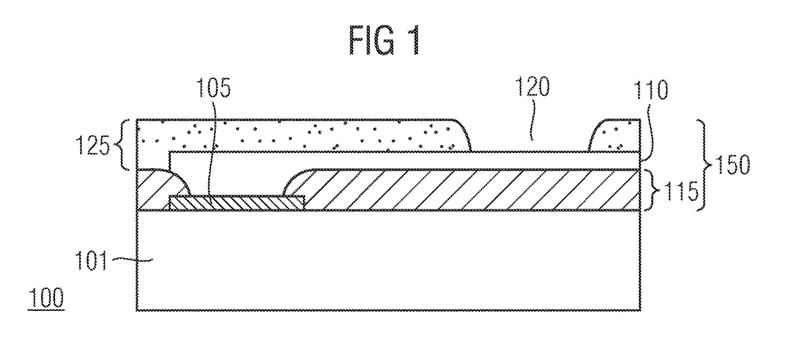
FIG. 1 illustrates a semiconductor device cross-section.

FIG. 1 illustrates a simplified cross-section of an exemplary semiconductor device 100. The substrate 101 includes a number of built-up layers which form the active layers (not shown) of the device. A bond pad 105 is attached to interconnects (not shown) originating from within the substrate 101. Bond pads 105 may be formed of any suitable material, including, for example, aluminum (Al), copper (Cu), titanium (Ti), or Gold (Au). The material used to form bond pads 105 is not limiting with respect to this disclosure.

An electrical connection to an external device may be formed directly to bond pad 105 or, as is more frequently practiced, bond pad 105 forms a connection to the redistribution layer 150. Redistribution layer 150 is formed upon substrate 101. Redistribution layer 150 is formed from a first dielectric layer 115, redistribution trace 110, and second dielectric layer 125. In an embodiment, first dielectric layer 115 is formed of boron phosphate silicate glass (BPSG). The type of dielectric used is not critical for the purposes of this disclosure, however, and as such, other commonly used semiconductor dielectrics such as silicon dioxide ($SiO_2$), silicon nitride (SiN) or other known dielectric materials may be used.

An opening 120 in the second dielectric layer 125 forms a second bond pad 120. In an aspect of the disclosure, second bond pad 120 (and hence redistribution trace 110) is formed of titanium (Ti). The materials specified herein are not critical, however, and thus the disclosed bond pad adhesion method is compatible with other metals commonly used in semiconductor devices, such as copper (Cu), nickel (Ni), gold (Au), aluminum (Al), or alloys or layers formed from combinations of these materials. It is the second bond pad 120 associated with the redistribution layer 150 that will be the object of the following exemplary embodiments.

Figure 2:
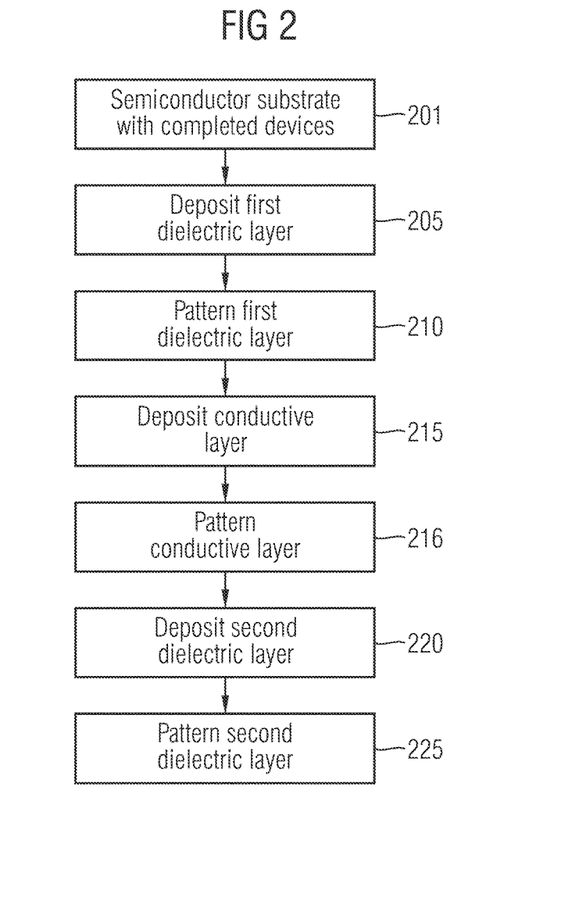
FIG. 2 illustrates a process in accordance with aspects of the disclosure.

FIG. 2 illustrates a sequence of process steps in accordance with an aspect of the disclosure, with further reference to the structure shown in FIG. 1. FIG. 2 is an exemplary sequence, and thus may not show all layers or steps used in a typical manufacturing sequence. As such and as will become apparent, the presence or absence of particular device fabrication steps or layers should not be viewed as limiting with respect to the disclosed method for improving bond pad adhesion.

This discussion assumes that at step 201, a number of semiconductor devices have been created in a semiconductor substrate through what is typically referred to as the "front end" of the process, in which, as is well understood in the art, the die layers have been deposited. Moreover, bond pads have been formed on the surface of the device. A single device and bond pad are illustrated by features 101 and 105 on FIG. 1, for instance.

At 205, a first dielectric layer is deposited on the device. The type of dielectric is not important for the purposes of this disclosure, and thus is not limiting. For the purposes of this embodiment, the dielectric comprises BPSG. This layer is similar to layer 115 in FIG. 1, for instance.

At 210, a patterning process in an aspect of the disclosure is performed. In this step, a pattern of geometric structures is formed in the surface of the first dielectric layer, as will be disclosed in further detail below. The patterning is formed through a photolithography process, for example.

At 215, the redistribution layer is deposited on the patterned first dielectric layer. This layer is similar to layer 110 in FIG. 1. This layer is a conductive layer, and thus can be formed of any number of differing materials. Examples of useful conducting materials for this step include Ni, Cu, Al, Ti, or Au, or mixtures or alloys thereof.

At 216, the conductive layer is patterned. This can be done using any process useful for metal patterning, such as dry etch or a wet chemical etch. The nature of the etch process used for patterning the conductive layer is not limiting for the purposes of this disclosure.

At 220, a second dielectric layer may be formed on top of the redistribution layer. This layer is similar to layer 125 in FIG. 1. The nature of the dielectric used is not limiting for the purposes of this disclosure.

At 225, a photolithography process may be performed to form a second bond pad. This bond pad is similar to structure 120 in FIG. 1. At the completion of this step, the semiconductor device proceeds for further processing. As the bond pad adhesion method disclosed herein is not dependent on these processing steps, they will not be discussed further.

FIGS. 3A-3D illustrate a method for producing bond pads with increased adhesion in an aspect of the disclosure. The reference numbers used to identify the various layers are consistent with those used to identify the layers in FIG. 1, for ease of reference.

Figure 3A:
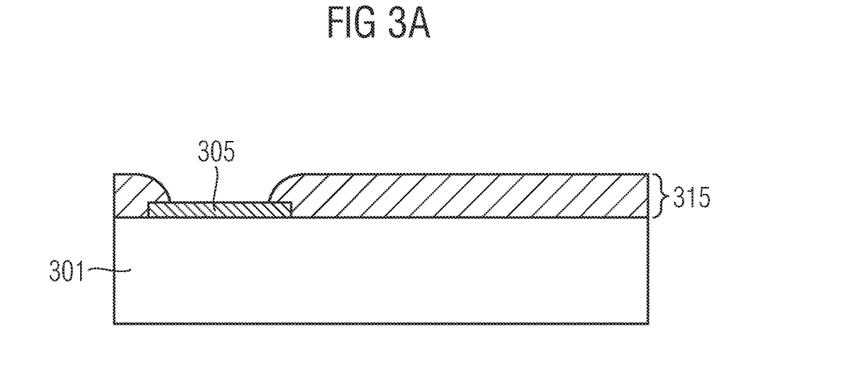
FIGS. 3A-E illustrate an etching process in accordance with aspects of the disclosure.

FIG. 3A illustrates a semiconductor device including a die 301, first bond pad 305, and first dielectric layer 315. This corresponds to step 205 of FIG. 2. With continued reference to FIG. 3A, the first dielectric layer 315 may have a top surface and a bottom surface. The bottom surface of the first dielectric layer 315 may adjoin the die 301. In this exemplary embodiment, the first dielectric layer 315 comprises boron phosphate silicate glass (BPSG).

Figure 3B:
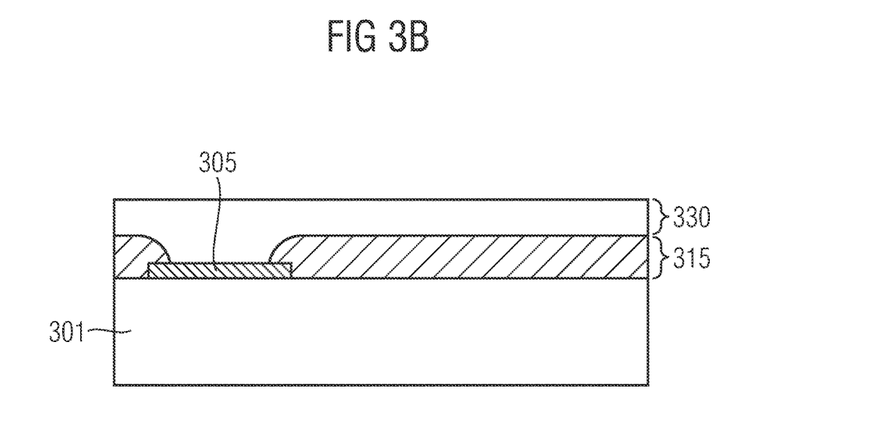

As illustrated in FIG. 3B, a photoresist layer 330 is deposited. Photoresist layer 330 is of a type normally used in semiconductor device photolithography processes. In this exemplary embodiment, the photoresist is of a type typically used for dry etch processes.

Figure 3C:
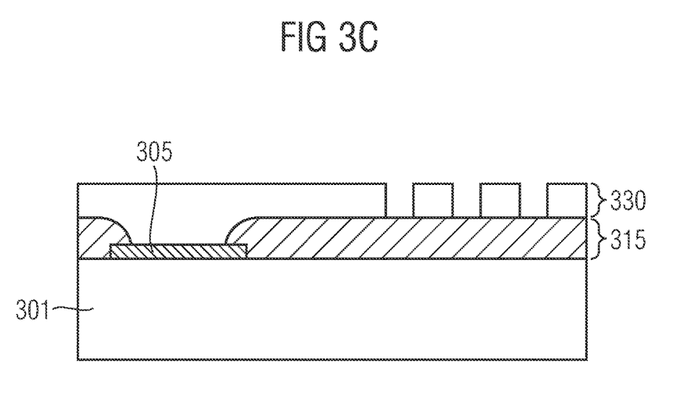

In FIG. 3C, the photoresist layer 330 is exposed and patterned using a photomask and light source (not shown) appropriate for the photoresist layer 330 used. After exposing and patterning photoresist layer 330, unpatterned photoresist is removed.

Following removal of the unpatterned photoresist, a dry chemical etch is performed, for example. Dry chemical etch will vary depending on the material used for first dielectric layer 315. For BPSG, the etchant gas may be a mixture of carbon tetrafluoride ($CF_4$), fluoromethane ($CHF_3$), and oxygen ($O_2$), with argon (Ar) used as a carrier gas, for example. At the completion of the etch process, the remaining photoresist structures 330 are removed.

Figure 3D:
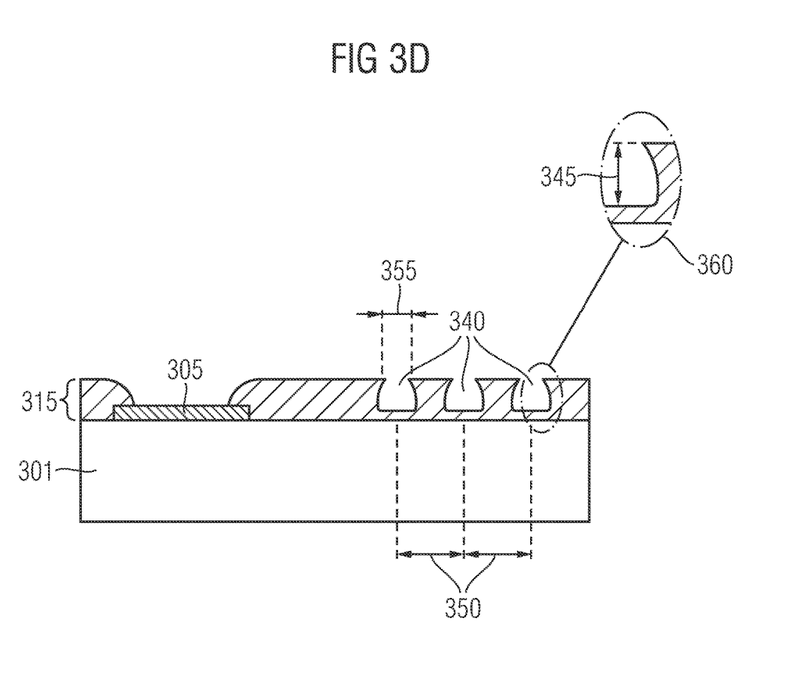

In FIG. 3D, the patterned first dielectric layer 315 is illustrated. Geometric structures 340 have been formed in the first dielectric layer 315. In an aspect of the disclosure, geometric structures 340 are roughly circular in shape. The depth 345 of geometric structure 340 will vary depending on manufacturing requirements. In an aspect of the disclosure, depth 345 will range from 100 to 300 nm, for example. In some aspects, each of the geometric structures 340 may define a respective blind hole within the first dielectric layer 315. According to at least one aspect, each blind hole may extend from the top surface of the first dielectric layer 315 to a respective intermediate surface of the first dielectric layer 315 that is between the top and bottom surfaces of the first dielectric layer 315. Geometric structures 340 have a consistent spacing 350. Spacing 350 will also vary depending on application. In an embodiment, spacing will range from between 2 to 50 µm. Geometric structures 340 may also have a range of diameters 355. Geometric structures 340 diameter 355 may range from between 1 to 5 µm, for example. In an aspect of the disclosure, geometric structure 340 resulting from dry etch may have an undercut profile, as shown at 360. An undercut profile of geometric structure 340 may define a cross-sectional gap width within the first dielectric layer 315, such that the cross-sectional gap width increases, at least in part, from the top surface towards its respective intermediate surface within the first dielectric layer 315.

Figure 3E:
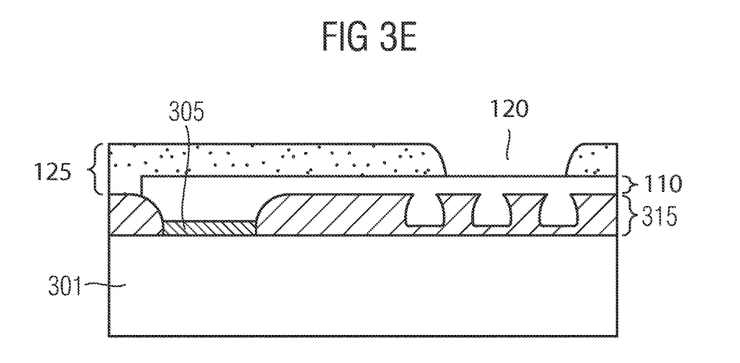

Following patterning, the device proceeds through the remainder of the process, as illustrated in FIG. 2 at 215, 220, and 225. This process results in the exemplary structure illustrated at FIG. 3E.

FIGS. 4A-4D illustrate another method for producing bond pads with increased adhesion in an aspect of the disclosure. The reference numbers used to identify the various layers are consistent with those used to identify the layers in FIG. 1, for ease of reference.

Figure 4A:
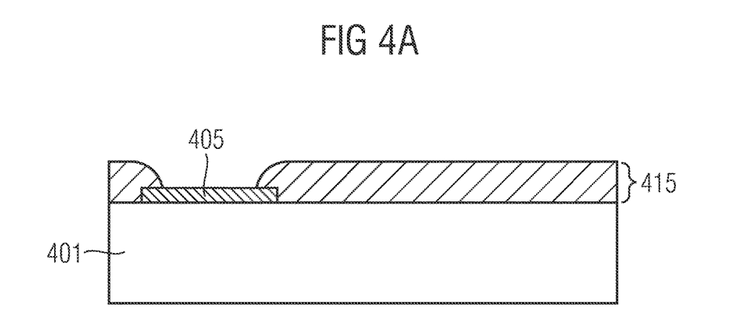
FIGS. 4A-4E illustrate an etching process in accordance with aspects of the disclosure.

FIG. 4A illustrates a semiconductor device including a die 401, first bond pad 405, and first dielectric layer 415. This corresponds to step 205 of FIG. 2. With continued reference to FIG. 4A, the first dielectric layer 415 may have a top surface and a bottom surface. The bottom surface of the first dielectric layer 415 may adjoin the die 401. In this exemplary embodiment, the first dielectric layer 415 comprises boron phosphate silicate glass (BPSG).

Figure 4B:
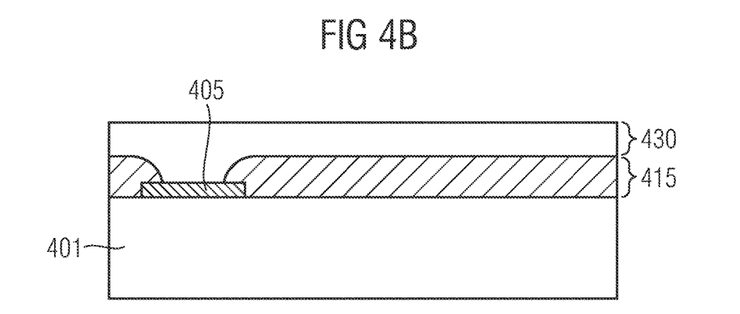

As illustrated in FIG. 4B, a photoresist layer 430 is deposited. Photoresist layer 430 is of a type normally used in semiconductor device photolithography processes. In this embodiment, the photoresist is of a type typically used for wet etch processes.

Figure 4C:
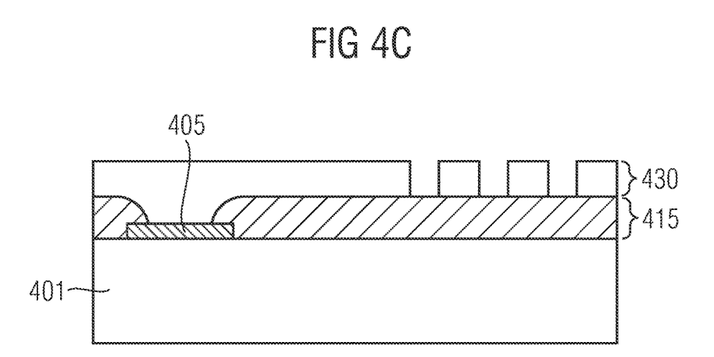

In FIG. 4C, the photoresist layer 430 is exposed and patterned using a photomask and light source (not shown) appropriate for the photoresist layer 430 used. After exposing and patterning photoresist layer 430, unpatterned photoresist is removed.

Following removal of the unpatterned photoresist, a wet chemical etch is performed. Wet chemical etch will vary depending on the material used for first dielectric layer 415. For BPSG, the etchant may be a hydrofluoric acid (HF)/ammonium fluoride (NH$_4$F) buffered oxide etch solution, for instance. At the completion of the etch process, the remaining photoresist structures 430 are removed.

Figure 4D:
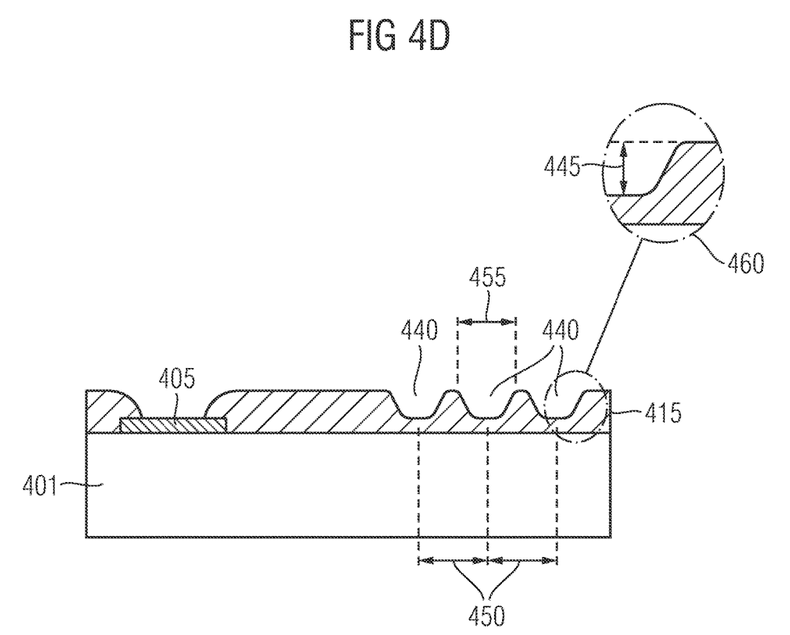

In FIG. 4D, the patterned first dielectric layer 415 is shown. Geometric structures 440 have been formed in the first dielectric layer 415. In an aspect of the disclosure, geometric structures 440 are roughly circular in shape. The depth 445 of geometric structure 440 will vary depending on manufacturing requirements. In an aspect of the disclosure, depth 445 will range from 100 to 300 nm, for example. In some aspects, each of the geometric structures 440 may define a respective blind hole within the first dielectric layer 415. According to at least one aspect, each blind hole may extend from the top surface of the first dielectric layer 415 to a respective intermediate surface of the first dielectric layer 415 that is between the top and bottom surfaces of the first dielectric layer 415. Geometric structures 440 have a consistent spacing 450. Spacing 450 will also vary depending on application. In an embodiment, spacing will range from between 5 to 50 μm. Geometric structures 440 may also have a range of diameters 455. Geometric structure 440 diameter 455 may range from between 1 to 5 μm, for example. Geometric structure 440 resulting from wet etch may have a sloped profile, as shown at 460. A sloped profile of geometric structure 440 may define a cross-sectional gap width within the first dielectric layer 415, such that the cross-sectional gap width decreases, at least in part, from the top surface towards its respective intermediate surface within the first dielectric layer 415.

Figure 4E:
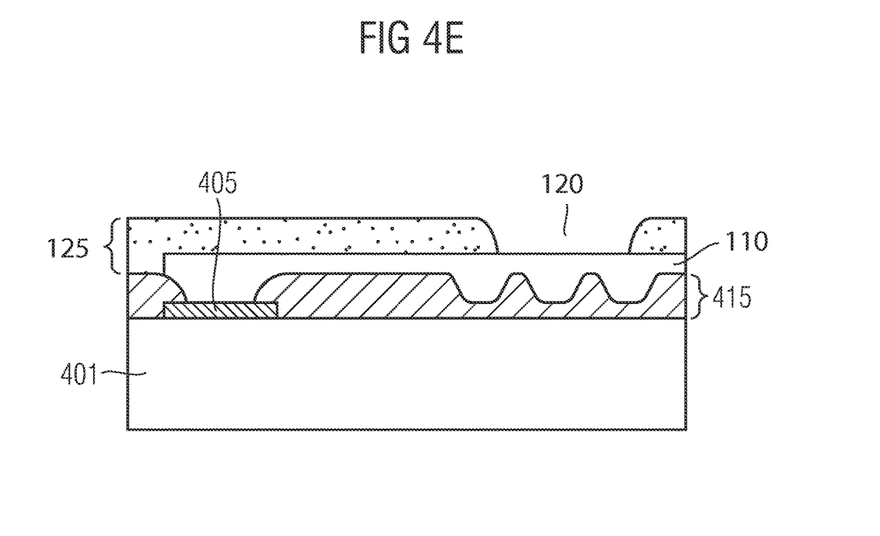

Following patterning, the device proceeds through the rest of the process, as illustrated in FIG. 2 at 215, 220, and 225. This process results in the exemplary structure illustrated at FIG. 4E.

The differing shape of the geometric structures created by the two methods may affect metal layer retention. Specifically, some metal/dielectric systems may exhibit better adhesion with geometric structures created using a dry etch procedure, while others may benefit from the use of wet etch system. In an aspect of the disclosure, a titanium layer on BPSG may exhibit better retention when geometric structures are created using a dry etch procedure, as illustrated in FIG. 3.

A person skilled in the art will recognize that combinations of the above exemplary embodiments may be formed. For example, in some aspects of the disclosure the both a wet etch and a dry etch procedure may be necessary to create geometric structures of the proper size and shape in the first dielectric layer. Moreover, the present disclosure anticipates the possibility that a plurality of materials and deposition steps may be required to form what is referred to as "first dielectric layer" in the disclosed embodiments. Similarly, a plurality of metal layers may be used to form the redistribution trace.

While the invention has been particularly shown and described with reference to specific aspects of the disclosure, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device structure, comprising:
   at least one semiconductor device comprising a semiconductor substrate;
   a first dielectric layer having a top surface and a bottom surface,
   wherein the bottom surface adjoins the semiconductor substrate;
   geometric structures formed in the first dielectric layer,
   wherein each of the geometric structures defines a respective blind hole in the first dielectric layer extending from the top surface to a respective intermediate surface of the first dielectric layer that is between the top surface and the bottom surface, and
   at least one of the geometric structures has an undercut profile in the first dielectric layer, such that a cross-sectional gap width of the first dielectric layer increases, at least in part, from the top surface towards the respective intermediate surface; and
   a conductive layer on the first dielectric layer,
   wherein the conductive layer is at least located over the geometric structures and completely fills the geometric structures.

2. The semiconductor device structure of claim 1, wherein the conductive layer comprises a bond pad.

3. The semiconductor device structure of claim 2, wherein the bond pad is located over the geometric structures.

4. The semiconductor device structure of claim 1, further comprising a second dielectric layer disposed over the conductive layer.

5. The semiconductor device structure of claim 1, wherein the conductive layer comprises titanium (Ti).

6. The semiconductor device structure of claim 1, wherein the first dielectric layer comprises boron phosphorus silicate glass (BPSG).

7. The semiconductor device structure of claim 1, wherein the geometric structures have a depth ranging from 100-300 nm.

8. The semiconductor device structure of claim 1, wherein the geometric structures have a spacing ranging from 2-15 μm.

9. The semiconductor device structure of claim 1, wherein the geometric structures have a spacing formed in the range 15-30 μm.

10. The semiconductor device structure of claim 1, wherein the geometric structures have a diameter formed in the range 1-5 μm.

11. A method of depositing a conductive layer on a semiconductor device, the method comprising:
  providing at least one semiconductor device that comprises a semiconductor substrate;
  forming a first dielectric layer on the at least one semiconductor device, wherein the first dielectric has a top surface and a bottom surface, wherein the bottom surface adjoins the semiconductor substrate;
  forming a plurality of geometric structures in the first dielectric layer,
  wherein each of the geometric structures defines a respective blind hole in the first dielectric layer extending from the top surface to a respective intermediate surface of the first dielectric layer that is between the top surface and the bottom surface, and
  at least one of the geometric structures has an undercut profile in the first dielectric layer, such that a cross-sectional gap width of the first dielectric layer increases, at least in part, from the top surface towards the respective intermediate surface; and
  depositing a first conductive layer on the first dielectric layer, such that the first conductive layer is at least located over the geometric structures and completely fills the geometric structures.

12. The method of depositing a conductive layer of claim 11, wherein the plurality of geometric structures are formed at a depth between 100 and 300 nm.

13. The method of depositing a conductive layer of claim 11, wherein the plurality of geometric structures are formed at a spacing ranging from 5-15 μm.

14. The method of depositing a conductive layer of claim 11, wherein the plurality of geometric structures are formed at a spacing ranging from 15-30 μm.

15. The method of depositing a conductive layer of claim 11, wherein the plurality of geometric structures are formed with a diameter in the range 1-5 μm.

16. The method of depositing a conductive layer of claim 11, wherein the conductive layer comprises a bond pad located above the geometric structures.

17. The method of depositing a conductive layer of claim 11, wherein the conductive layer comprises Ti.

18. The method of depositing a conductive layer of claim 11, wherein the first dielectric layer comprises BPSG.

19. A semiconductor device structure, comprising:
  at least one semiconductor device comprising a semiconductor substrate,
  wherein a first bond pad is disposed on a first surface of the semiconductor substrate;
  a first dielectric layer having a top surface and a bottom surface,
  wherein the bottom surface of the first dielectric layer adjoins the semiconductor substrate at the first surface of the semiconductor substrate, and
  the first dielectric layer defines a through-hole opening over at least a portion of the first bond pad;
  geometric structures formed in the first dielectric layer,
  wherein each of the geometric structures defines a respective blind hole in the first dielectric layer extending from the top surface to a respective intermediate surface of the first dielectric layer that is between the top surface and the bottom surface, and
  at least one of the geometric structures has an undercut profile in the first dielectric layer; and
  a conductive layer on the first dielectric layer,
  wherein the conductive layer is at least located over the geometric structures and completely fills the geometric structures, and
  the conductive layer further extends into the through-hole opening so as to electrically and mechanically connect to the first bond pad.

20. The semiconductor device of claim 19, wherein the at least one of the geometric structures has said undercut profile, such that a cross-sectional gap width of the first dielectric layer increases, at least in part, from the top surface towards the respective intermediate surface.

* * * * *